US009312052B2

(12) United States Patent
Mitsuhashi et al.

(10) Patent No.: US 9,312,052 B2
(45) Date of Patent: Apr. 12, 2016

(54) SUPERCONDUCTING WIRE MATERIAL, SUPERCONDUCTING WIRE MATERIAL CONNECTION STRUCTURE, SUPERCONDUCTING WIRE MATERIAL CONNECTION METHOD, AND TREATMENT METHOD OF SUPERCONDUCTING WIRE MATERIAL END

(71) Applicants: FURUKAWA ELECTRIC CO., LTD., Tokyo (JP); INTERNATIONAL SUPERCONDUCTIVITY TECHNOLOGY CENTER, Kanagawa (JP)

(72) Inventors: Takaharu Mitsuhashi, Tokyo (JP); Masashi Yagi, Tokyo (JP); Ryo Nakayama, Tokyo (JP)

(73) Assignee: FURUKAWA ELECTRIC CO., LTD, Tokyo (JP)

( * ) Notice: Subject to any disclaimer, the term of this patent is extended or adjusted under 35 U.S.C. 154(b) by 0 days.

(21) Appl. No.: 14/235,028

(22) PCT Filed: Apr. 30, 2013

(86) PCT No.: PCT/JP2013/062594
§ 371 (c)(1),
(2) Date: Jan. 24, 2014

(87) PCT Pub. No.: WO2013/165001
PCT Pub. Date: Nov. 7, 2013

(65) Prior Publication Data
US 2015/0200041 A1    Jul. 16, 2015

(30) Foreign Application Priority Data
May 2, 2012    (JP) .................................. 2012-105014

(51) Int. Cl.
*H01B 12/00*    (2006.01)
*H01L 39/00*    (2006.01)
(Continued)

(52) U.S. Cl.
CPC ................ *H01B 12/06* (2013.01); *H01B 12/02* (2013.01); *H01B 13/00* (2013.01); *H01L 39/02* (2013.01); *H01R 4/68* (2013.01); *H02G 1/14* (2013.01); *H02G 15/34* (2013.01); *Y02E 40/648* (2013.01)

(58) Field of Classification Search
CPC ............ H01L 39/2474; H01L 39/2461; H01L 39/2464; H01L 39/49888; H01L 39/143
See application file for complete search history.

(56) References Cited

U.S. PATENT DOCUMENTS

2006/0063680 A1*   3/2006   Ignatiev et al. ................ 505/329

FOREIGN PATENT DOCUMENTS

CN    101175631 A    5/2008
CN    101785123 A    7/2010
(Continued)

OTHER PUBLICATIONS

International Preliminary Report on Patentability for PCT Application Serial No. PCT/JP2013/062594, mailed Nov. 4, 2014, 21 pages.
(Continued)

*Primary Examiner* — Colleen Dunn
(74) *Attorney, Agent, or Firm* — Amin, Turocy & Watson, LLP

(57) ABSTRACT

Superconducting wire material, superconducting wire material connection structure, superconducting wire material connection method, and treatment method of superconducting wire material end are shown. According to one implementation, a superconducting wire material connection structure includes, a first superconducting wire material, a second superconducting wire material, and a third superconducting wire material. The first superconducting wire material and the second superconducting wire material each include an end provided with a concave section in which at least a superconducting layer is removed and a filling section in which filling material is filled in the concave section. The first superconducting wire material and the second superconducting wire material are positioned so that the ends oppose to each other. A third superconducting wire material is connected to both the first superconducting wire material and the second superconducting wire material.

13 Claims, 9 Drawing Sheets

(51) Int. Cl.
*H01B 12/06* (2006.01)
*H01R 4/68* (2006.01)
*H01L 39/02* (2006.01)
*H01B 12/02* (2006.01)
*H01B 13/00* (2006.01)
*H02G 1/14* (2006.01)
*H02G 15/34* (2006.01)

(56) References Cited

FOREIGN PATENT DOCUMENTS

| | | |
|---|---|---|
| CN | 101971273 A | 2/2011 |
| CN | 102227828 A | 10/2011 |
| JP | 2919944 | 7/1999 |
| JP | 2000133067 | 5/2000 |
| JP | 2001319750 | 11/2001 |
| JP | 2007266149 | 10/2007 |
| JP | 2008234957 | 10/2008 |
| JP | 2010003435 | 1/2010 |
| JP | 2010129465 | 6/2010 |
| JP | 2011124188 | 6/2011 |
| WO | 2005079220 | 9/2005 |
| WO | 2008118127 | 10/2008 |
| WO | 2012037231 | 3/2012 |

OTHER PUBLICATIONS

International Search Report for PCT Application Serial No. PCT/JP2013/062594, mailed Jul. 2, 2013, 8 pages.
European Search Report for European Application Serial No. 13784234.0, dated May 4, 2015, 6 pages.
Korean Office Action for Korean Patent Application No. 10-2014-7001467, dated Jan. 13, 2016, 9 pages (with translation).
Chinese Office Action for Chinese Patent Application No. 201380002251.7, dated Nov. 20, 2015, 12 pages (with translation).

* cited by examiner

SUPERCONDUCTING WIRE MATERIAL, SUPERCONDUCTING WIRE MATERIAL CONNECTION STRUCTURE, SUPERCONDUCTING WIRE MATERIAL CONNECTION METHOD, AND TREATMENT METHOD OF SUPERCONDUCTING WIRE MATERIAL END

CROSS-REFERENCE TO RELATED APPLICATIONS

This application is a U.S. National Stage application of, and claims priority to, PCT Patent Application No. PCT/JP2013/062594, filed Apr. 30, 2013 and entitled "SUPERCONDUCTING WIRE MATERIAL, SUPERCONDUCTING WIRE MATERIAL CONNECTION STRUCTURE, SUPERCONDUCTING WIRE MATERIAL CONNECTION METHOD, AND TERMINAL TREATMENT METHOD OF SUPERCONDUCTING WIRE MATERIAL"; which claims priority to Japanese Patent Application No. 2012-105014, filed May 2, 2012. The entireties of the above-referenced applications are incorporated herein by reference.

TECHNICAL FIELD

The present invention relates to superconducting wire material, a superconducting wire material connection structure, a superconducting wire material connection method, and a treatment method of superconducting wire material end.

BACKGROUND ART

Conventionally, when superconducting wire material is electrically connected at an intermediate connection section of a superconducting cable, an end of the superconducting wire material is cut with scissors or electrical tools at a site where the superconducting cable is laid.

For example, the superconducting wire material includes a structure in which component layers such as an intermediate layer, a superconducting layer, and a stabilizing layer are overlapped in order on a substrate of a tape shape, and depending on the situation when the superconducting wire material is cut, peeling of the superconducting layer occurred. When pieces of the superconducting wire material are connected in a state where the superconducting layer is damaged, there were cases where the superconducting layer deteriorated after executing the connection, and the superconducting performance decreased.

As a method of connection without damaging the layers composing the superconducting wire material, there is known a technique of performing treatment of an end so that the length which projects out at the end portion of the superconducting wire material is different according to each composing layer. The portions where the substrates are most projected out are overlapped and joined by depositing a superconducting thin film by vapor deposition to connect the pieces of superconducting wire material (for example, see patent document 1).

PRIOR ART DOCUMENT

Patent Document

Patent Document 1: Japanese Patent No. 2919944

DISCLOSURE OF THE INVENTION

Problems to be Solved by the Invention

However, in the case of the technique described in the Patent Document 1, it is difficult to bring a large vapor deposition apparatus to a site where a superconducting cable is laid, and therefore, this is not a practical connection method.

Alternatively, if the end of the superconducting wire material is cut with a laser cutting processing machine, the cutting face is fused by heat, and therefore, trouble such as the superconducting layer peeling does not occur. However, it is difficult to bring a large laser cutting processing machine to a site where a superconducting cable is laid, and therefore, this is not a practical connection method.

The purpose of the present invention is to provide superconducting wire material, a superconducting wire material connection structure, a superconducting wire material connection method, and a treatment method of superconducting wire material end in which stable superconducting performance can be obtained.

Means for Solving the Problem

In order to solve the above problems, according to the invention of claim 1, there is provided a superconducting wire material connection structure which connects superconducting wire material to each other, the superconducting wire material including a superconducting layer on a substrate, the superconducting wire material connection structure comprising:

a first superconducting wire material and a second superconducting wire material each including an end provided with:
  a concave section in which at least the superconducting layer is removed; and
  a filling section in which filling material is filled in the concave section,
  wherein the first superconducting wire material and the second superconducting wire material are positioned so that the respective ends oppose to each other; and
a third superconducting wire material which is connected to both the first superconducting wire material and the second superconducting wire material.

According to the invention of claim 2, the superconducting wire material connection structure of claim 1, wherein the third superconducting wire material is connected to the first superconducting wire material and the second superconducting wire material with a fusing section including material with a melting point lower than the filling material.

According to the invention of claim 3, the superconducting wire material connection structure of claim 2, wherein a superconducting layer of the third superconducting wire material is connected to superconducting layers of the first superconducting wire material and the second superconducting wire material through the fusing section.

According to the invention of claim 4, the superconducting wire material connection structure of any one of claims 1 to 3, wherein the substrates are joined to each other by welding.

According to the invention of claim 5, the superconducting wire material connection structure of any one of claims 1 to 4, wherein,
  the superconducting layer is formed on only one face side of the substrate in the superconducting wire material; and
  the third superconducting wire material and the first superconducting wire material, and the third superconducting wire material and the second superconducting wire material are connected by connecting respective faces on a side where the superconducting layer is formed.

According to the invention of claim 6, a superconducting wire material which is a tape shape including a superconducting layer on a substrate, the superconducting wire material comprising:

a concave section provided partially in a longitudinal direction, the concave section in which at least the superconducting layer is entirely removed in a width direction; and a filling section in which filling material is filled in the concave section.

According to the invention of claim 7, the superconducting wire material of claim 6, further comprising, an intermediate layer between the substrate and the superconducting layer, wherein, at least a portion of the intermediate layer is removed in the concave section.

According to the invention of claim 8, the superconducting wire material of claim 6 or 7, wherein, a portion of the concave section is formed in an end of the superconducting wire material; and an interface between the filling section and the substrate is exposed from an edge face of the end.

According to the invention of claim 9, the superconducting wire material of claim 8, wherein the end is provided with a fusing section including material with a melting point lower than the filling material.

According to the invention of claim 10, a superconducting wire material connection method which connects superconducting wire material to each other, the superconducting wire material including a superconducting layer on a substrate, the superconducting wire material connection method comprising:

positioning a first superconducting wire material and a second superconducting wire material so that respective ends oppose to each other, wherein the first superconducting wire material and the second superconducting wire material each include the end provided with a concave section in which the superconducting layer is removed, and a filling section in which filling material is filled in the concave section; and connecting a third superconducting wire material to the first superconducting wire material and the second superconducting wire material so as to bridge the first superconducting wire material and the second superconducting wire material.

According to the invention of claim 11, the superconducting wire material connection method of claim 10, wherein, the superconducting layer is formed on only one face side of the substrate in the superconducting wire material; and the third superconducting wire material is provided to bridge the first superconducting wire material and the second superconducting wire material, and the third superconducting wire material and the first superconducting wire material, and the third superconducting wire material and the second superconducting wire material are connected so that respective faces on a side where the superconducting layer is formed are opposed to each other.

According to the invention of claim 12, a treatment method of superconducting wire material end including a superconducting layer on a substrate, the method comprising:

forming a concave section by removing at least the superconducting layer;

forming a filling section by filling the concave section with filling material; and cutting a portion where the substrate and the filling section are overlapped and there is no superconducting layer between the substrate and the filling section.

According to the invention of claim 13, the treatment method of superconducting wire material end of claim 12, wherein an intermediate layer is formed between the substrate and the superconducting layer; and at least a portion of the intermediate layer is removed in the concave section.

Advantageous Effect of the Invention

According to the present invention, it is possible to easily connect the pieces of superconducting wire material so that stable superconducting performance can be obtained.

EMBODIMENT FOR CARRYING OUT THE INVENTION

A preferable embodiment of the present invention is described with reference to the drawings. Although various limitations which are technically preferable are added to the embodiment of the present invention, the scope of the invention is not limited to the embodiments described below and the illustrated examples.

Figure 1:
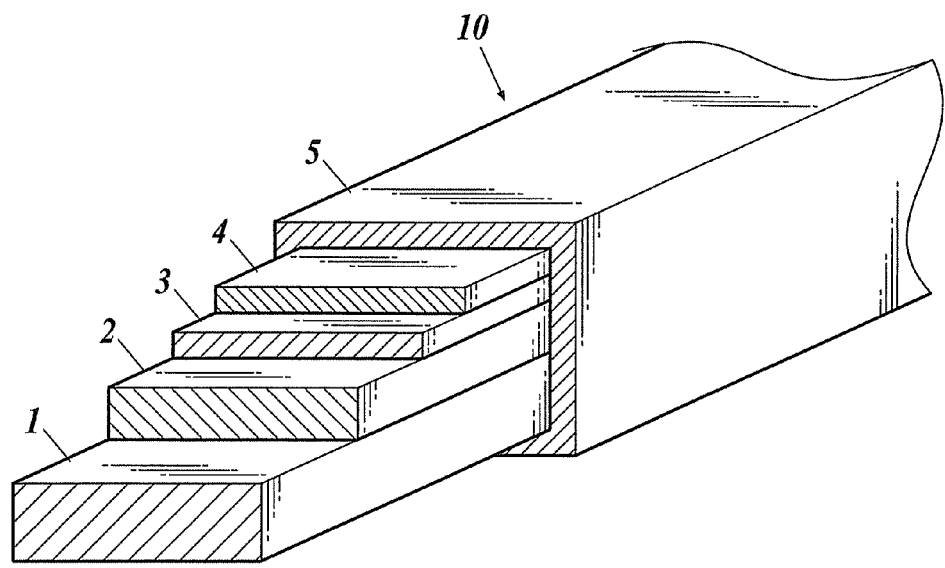
FIG. 1 is a diagram describing a structure of layers in superconducting wire material.

FIG. 1 is a diagram describing a structure of layers of a superconducting wire material.

For example, as shown in FIG. 1, a superconducting wire material 10 is a superconducting wire material in a tape shape including a structure in which composing layers such as an intermediate layer 2, a superconducting layer 3, and a protecting layer 4, are overlapped in order on a substrate 1, and a stabilizing layer 5 which covers a surrounding area of the overlapping structure.

For example, the substrate 1 is a metallic substrate in a tape shape. The substrate 1 can also be a metallic substrate with a low magnetic property or a ceramic substrate. For example, metal such as Co, Cu, Cr, Ni, Ti, Mo, Nb, Ta, W, Mn, Fe, Ag, etc. or alloys of the above which excel in strength and heat resistance can be used as material for the metallic substrate. Specifically, from the viewpoint of excelling in corrosion resistance and heat resistance, it is preferable to use a Ni based alloy such as Hastelloy (registered trademark), Inconel (registered trademark) or a Fe based alloy such as stainless steel. Various ceramics can be provided on the various metallic material as described above. For example, MgO, SrTiO$_3$, or yttrium-stabilized zirconia are used as material of a ceramics substrate.

The intermediate layer 2 is a layer formed to enable high in-plane orientation in the superconducting layer 3. For example, physical characteristic values such as thermal expansion rate and lattice constant of the intermediate layer 2 show intermediate values between material of the substrate 1 and superconducting material included in the superconducting layer 3. The intermediate layer 2 can be a structure of a single layer or a structure of multi-layers. In a multi-layer structure, although the number of layers and the type of layers are not limited, the intermediate layer 2 can be a structure of the following layers overlapped in this order, a bed layer including amorphous Gd$_2$Zr$_2$O$_{7-\delta}$ ($\delta$ is oxygen non-stoichiometry amount), a forced orienting layer including crystalline MgO, etc. and formed from an IBAD method (Ion Beam Assisted Deposition), an LMO layer including LaMnMO$_{3+\delta}$ ($\delta$ is oxygen non-stoichiometry amount), and a cap layer including CeO$_2$, etc.

The superconducting layer 3 is a superconducting layer including oxide superconducting material, and is a layer formed by for example, a MOCVD method. It is preferable that the superconducting layer 3 includes specifically, a copper-oxide superconducting material. It is preferable that REBa$_2$Cu$_3$O$_{7-\delta}$ (hereinafter referred to as RE type superconducting material) as a high temperature superconducting material is used as a copper-oxide superconducting material. RE in the RE type superconducting material is a single rare earth element such as Y, Nd, Sm, Eu, Gd, Dy, Ho, Er, Tm, Yb, and Lu or a plurality of rare earth elements, and among the above, Y is preferable because substituting at a Ba site hardly occurs. $\delta$ is oxygen non-stoichiometry amount, and for example, is no less than 0 and no more than 1, and it is preferable that the amount is closer to 0 from the viewpoint of having a high superconducting transition temperature. Regarding the oxygen non-stoichiometry amount when high pressure oxygen annealing processing, etc., is performed using a device such as an autoclave, $\delta$ may be less than 0, in other words, a negative value.

The protecting layer 4 is, for example, a silver thin film formed by a sputtering method, and is a layer formed to protect the superconducting layer 3. The protecting layer 4 can be a structure with a single layer or a structure with multi-layers. In a multi-layer structure, the number of layers and the type of layers are not limited, and the structure can be the following layers overlapped in order, a silver stabilizing layer including silver, and a copper stabilizing layer including copper.

The stabilizing layer 5 is, for example, a copper film formed by a plating method, and is formed to electrically stabilize the wire material.

The above structure of the layers of the superconducting wire material 10 is common in the later described first superconducting wire material 11, second superconducting wire material 12, and third superconducting wire material 13. However, even if the structure does not include the intermediate layer 2 and the stabilizing layer 5, the structure is acceptable as long as the layers fully express the superconducting performance (includes critical current at a practical level).

Described next is a structure of the superconducting wire material end to connect the pieces of tape-shaped superconducting wire material to each other and a treatment method of the superconducting wire material end to form the end structure.

Figure 2A:
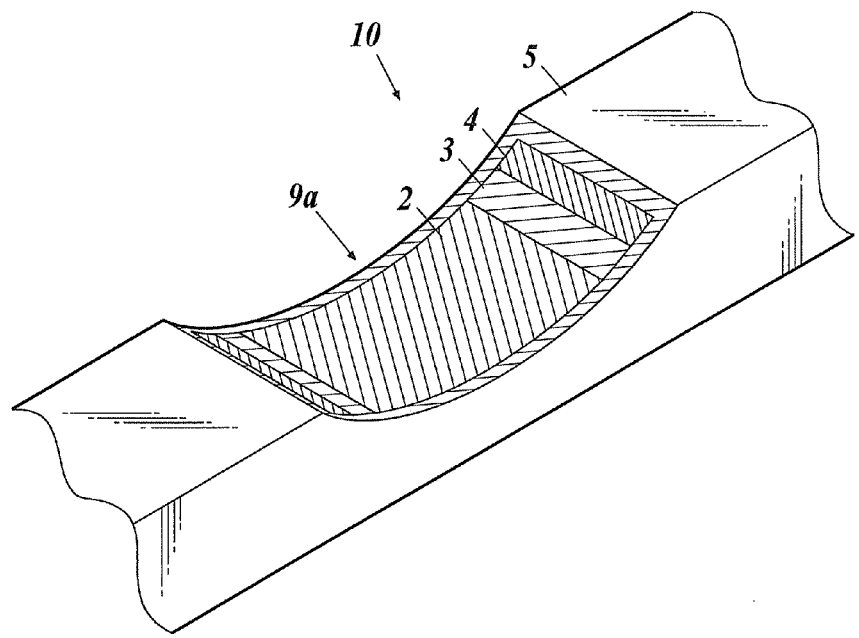
FIG. 2A is a diagram describing a step of forming an end of the superconducting wire material, and shows a state of forming a concave section in the superconducting wire material.

First, as shown in FIG. 2A, the superconducting wire material 10 is cut from the superconducting layer 3 side until the intermediate layer 2 is exposed to form the concave section 9a. In other words, a face on an opposite side of the substrate 1 side of the superconducting wire material 10 (face on superconducting layer 3 side) is cut with, for example, a leutor to remove the stabilizing layer 5, the protecting layer 4, and the superconducting layer 3 to form the concave section 9 with an exposing face which exposes the intermediate layer 2. It is possible to remove the entire intermediate layer 2 to form the concave section 9 with an exposing face which exposes the substrate 1.

Figure 2B:
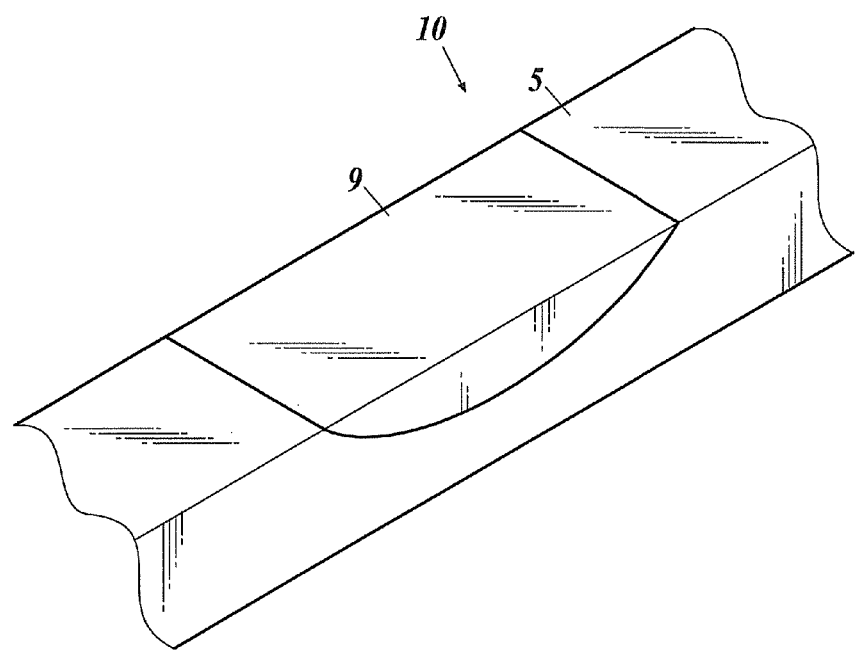
FIG. 2B is a diagram describing a step of forming the end of the superconducting wire material, and shows a state of providing a filling section in the concave section.

Next, as shown in FIG. 2B, a filling section 9 is formed by filling in filling material in the concave section 9a formed by removing a portion of the superconducting wire material 10. Solder and resin material can be used as the filling material and melted filling material is flown in the concave section 9a and solidified to form the filling section 9 which covers the exposing face. A conducting adhesive such as metallic paste as the filling material can be applied to the concave section 9a to form the filling section 9. Here, when the difference of the heat expansion coefficients between the filling material and the stabilizing layer 5 is set to a small value, it is possible to suppress damage of the exposing face of the concave section 9a when there is change in heat. Therefore, it is preferable to use material having a linear expansion coefficient of no more than $10 \times 10^{-6}/°$ C. and no less than $27 \times 10^{-6}/°$ C. as the filling material.

The filling section 9 is to be provided in a portion at least covering the interface between the intermediate layer 2 and the superconducting layer 3. When the filling material includes metallic material such as soldering and metallic paste, it is preferable to form the concave section 9a so that the substrate 1 is in an exposed state, in order to enhance the adhesion between the substrate 1 and the filling material (filling section 9). When the substrate 1 comes into contact with the filling material, it is preferable that the heat expansion coefficients of the substrate 1 and the filling material are close. Therefore, it is preferable that the filling material has a linear expansion coefficient of no more than $10 \times 10^{-6}/°$ C. and no less than $23 \times 10^{-6}/°$ C. When the substrate 1 is exposed in the concave section 9a, it is preferable that the filling section 9 covers both the interface between the substrate 1 and the intermediate layer 2, and the interface between the intermediate layer 2 and the superconducting layer 3.

The filling section 9 does not have to be formed within the concave section 9a, and the filling section 9 can be formed by flowing and solidifying the filling material to spread outside the concave section 9a so that a portion covers the surface of the stabilizing layer 5.

Figure 3A:
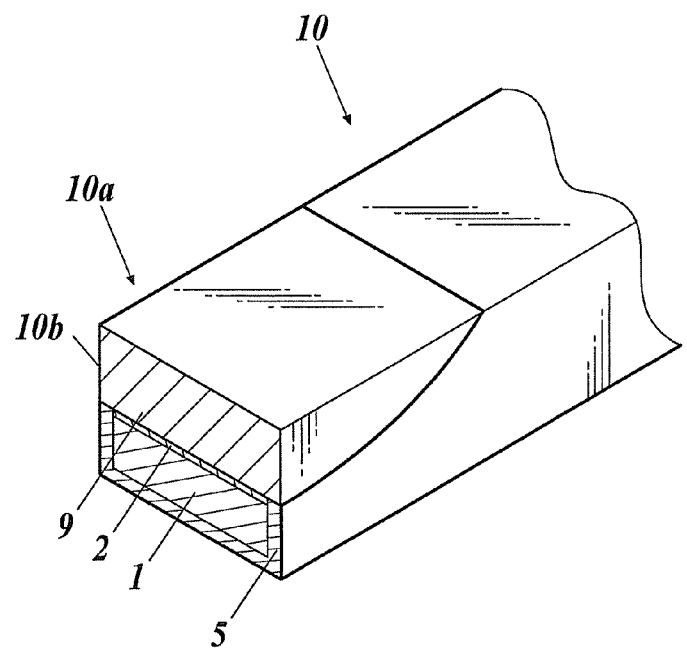
FIG. 3A is a perspective diagram showing the end of the superconducting wire material.
Figure 3B:
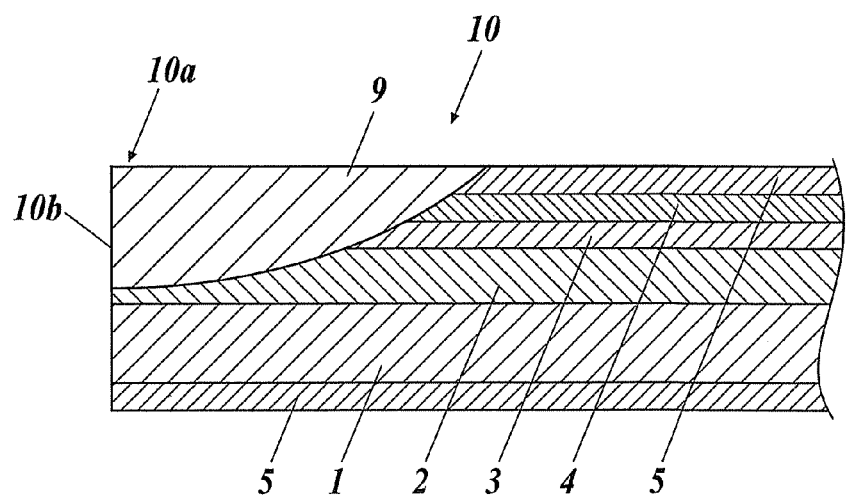
FIG. 3B is a cross-sectional diagram showing the end of the superconducting wire material.

Next, as shown in FIG. 3A and FIG. 3B, the portion where the substrate 1, the intermediate layer 2 and the filling section 9 are layered in the superconducting wire material 10 is cut to form an edge face 10b where the filling section 9 is exposed from the cut face and at least the superconducting layer 3 is not exposed from the cut face. The substrate 1, the intermediate layer 2, and the filling section 9 are exposed in a state adjacent to each other in the edge face 10b. In other words, the portion where the entire superconducting layer 3 is removed in the width direction of the superconducting wire material 10 is to be cut. The cut location where the edge face 10b is formed is to be an end 10a of the superconducting wire material 10. The superconducting wire material 10 including the end 10a is in a state including a portion of each of the concave section 9a and the filling section 9 in the end 10a. When the substrate 1 is exposed in the concave section 9a before cutting or the structure of the overlapped layers do not include the intermediate layer 2, the substrate 1 and the filling section 9 are exposed in a state adjacent to each other in the edge face 10b.

As described above, according to the end structure of the superconducting wire material of the present invention, a filling section 9 is provided in a portion where the intermediate layer 2 or the substrate 1 is removed from the superconducting layer 3 side of the superconducting wire material 10 until exposed so as to cover at least the interface between the intermediate layer 2 and the superconducting layer 3 and/or the interface between the substrate 1 and the superconducting layer 3. The ends 10a which are positioned opposing each other to connect the superconducting wire material 10 to each other include an edge face 10b which exposes the filling section 9 and does not expose at least the superconducting layer 3.

According to the end structure of the superconducting wire material, when the superconducting wire material 10 is cut to form the end 10a, the interface between the intermediate layer 2 and the superconducting layer 3 and/or the interface between the substrate 1 and the superconducting layer 3 is covered by the filling section 9, and therefore, the peeling and damage of the superconducting layer 3 can be suppressed. Moreover, the interface between the intermediate layer 2 and the superconducting layer 3 and/or the interface between the substrate 1 and the superconducting layer 3 is covered by the filling section 9 even after cutting, and therefore, it is possible to suppress the peeling and the damage of the superconducting layer 3 in handling the end 10a of the superconducting wire material 10 when the pieces of superconducting wire material 10 are connected to each other.

The peeling and the damage of the superconducting layer 3 in the end 10a of the superconducting wire material 10 can be suppressed as described above, and therefore, it is possible to reduce trouble such as the superconducting performance of the connection structure of the superconducting wire material 10 reducing without the deterioration of the damaged location of the superconducting layer 3 progressing after the connection of the superconducting wire material 10.

In other words, by using the superconducting wire material 10 including the end structure of the superconducting wire material of the present invention when the pieces of superconducting wire material 10 are connected to each other, it is possible to obtain stable superconducting performance.

Described next is the connection structure of the superconducting wire material connecting the pieces of tape-shaped superconducting wire material to each other and the connection method of the superconducting wire material.

Figure 4:
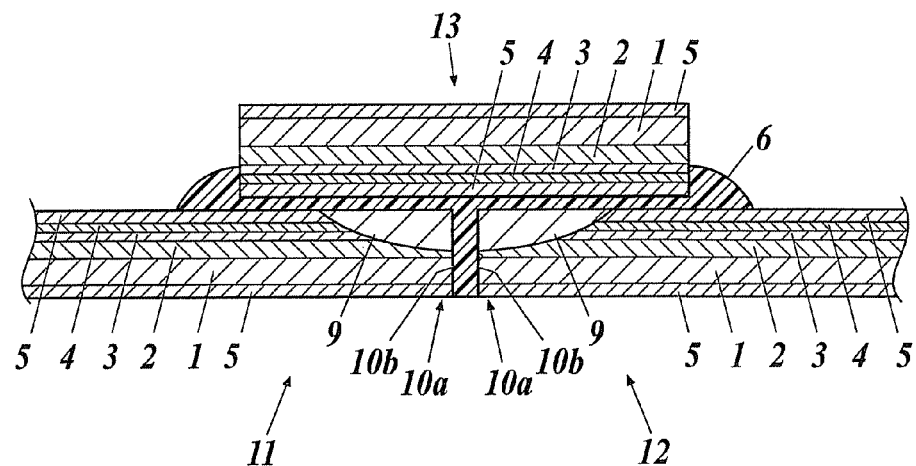
FIG. 4 is a cross-sectional diagram showing a connection structure of the superconducting wire material.
Figure 5:
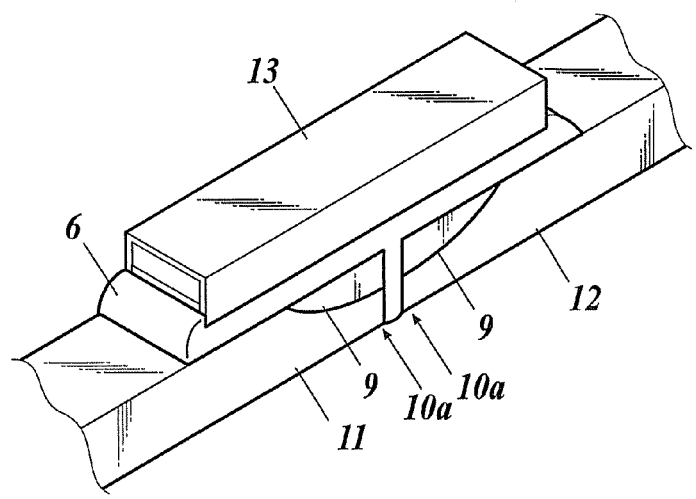
FIG. 5 is a perspective diagram showing the connection structure of the superconducting wire material.

FIG. 4 and FIG. 5 show a connection structure of the superconducting wire material connecting the first superconducting wire material 11 and the second superconducting wire material 12 each including the above described end 10 to the third superconducting wire material 13 for connection.

As shown in FIG. 4 and FIG. 5, the first superconducting wire material 11 and the second superconducting wire material 12 are positioned opposing each other with the respective ends 10a separated, and the third superconducting wire material 13 is connected through a fusing section 6 to the location where the first superconducting wire material 11 and the second superconducting wire material 12 are opposed to each other with a gap.

The third superconducting wire material 13 is provided along the longitudinal direction of the first superconducting wire material 11 and the second superconducting wire material 12 in a location where the respective ends 10a of the first superconducting wire material 11 and the second superconducting wire material 12 are positioned opposed to each other. The third superconducting wire material 13 is connected to both the first superconducting wire material 11 and the second superconducting wire material 12 so as to lie across the first superconducting wire material 11 and the second superconducting wire material 12.

Specifically, the fusing section 6 which fuses the first superconducting wire material 11, the second superconducting wire material 12, and the third superconducting wire material 13 to electrically connect the first superconducting wire material 11, the second superconducting wire material 12, and the third superconducting wire material 13 has a feature of including conducting material with a lower melting point than the filling section 9 (filling material). For example, when the filling section 9 includes a solder of a Sn—Zn type or a solder of a Sn—Cu type with a melting point of 200° C. or more, it is preferable that a solder of a Sn—Pb type or silver paste with a melting point of about 180° C. is used in the fusing section 6.

Since the fusing section 6 includes material with a melting point lower than the filling section 9, for example, when the solder with the low melting point which is to be the fusing section 6 is melted and attached to join the third superconducting wire material 13 to the ends 10a of the first superconducting wire material 11 and the second superconducting wire material 12, the filling section 9 including the solder with the high melting point does not melt and fall out. Therefore, the filling section 9 is able to suitably cover and protect the interface between the intermediate layer 2 and the superconducting layer 3.

Then, the third superconducting wire material 13 is joined in a state positioned so that the top and the bottom are opposite of the first superconducting wire material 11 and the second superconducting wire material 12. With this, the respective faces on the superconducting layer 3 side face each other in the connection portion.

The superconducting layer 3 of the third superconducting wire material 13 is connected through the fusing section 6 with the superconducting layer 3 of the first superconducting wire material 11 and the second superconducting wire material 12.

According to such connection structure of the superconducting wire material, the interface between the intermediate layer 2 and the superconducting layer 3 in the end 10a of the superconducting wire material is covered with the filling section 9. Therefore, it is possible to suppress peeling and damage of the superconducting layer 3 of the end 10a in handling the first superconducting wire material 11 and the second superconducting wire material 12 when the pieces of superconducting wire material are connected to each other.

In other words, the peeling and the damage of the superconducting layer 3 in the end 10a of the superconducting wire material can be suppressed when the first superconducting wire material 11 and the second superconducting wire material 12 are connected. Therefore, the progress of deterioration from the damaged location of the superconducting layer 3 after the connection can be slowed, and it is possible to reduce trouble such as the superconducting performance of the connection location of the superconducting wire material reducing.

The third superconducting wire material 13 has a length which crosses from the region where the filling section 9 is not provided in the end 10a of the first superconducting wire material 11 to the region where the filling section 9 is not provided in the end 10a of the second superconducting wire material 12. With this, it is possible to position the first superconducting wire material 11 and the third superconducting wire material 13 so that the respective faces on the superconducting layer 3 side oppose to each other without the filling section 9 in between and it is possible to position the second superconducting wire material 12 and the third superconducting wire material 13 so that the respective faces on the superconducting layer 3 side oppose to each other without the filling section 9 in between. Therefore, it is possible to suitably secure an electric current path through each superconducting wire material.

Consequently, according to the connection structure of the superconducting wire material of the present invention, it is possible to obtain stable superconducting performance.

The embodiments of the present invention are not limited to the above.

Figure 6:
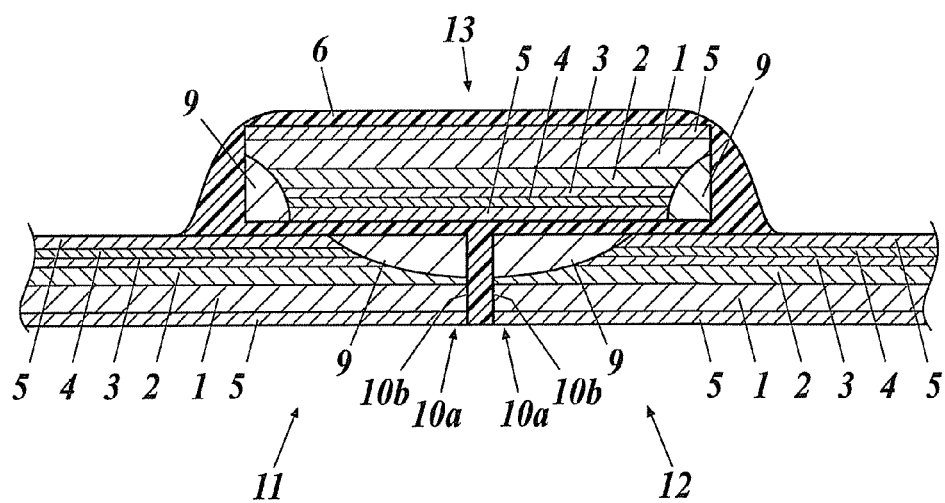
FIG. 6 is a cross-sectional diagram showing another embodiment of a connection structure of the superconducting wire material.

For example, as shown in FIG. 6, the filling section 9 can be formed in the ends 10a of both edges of the third superconducting wire material 13. By similarly forming the filling section 9 in the ends 10a of both edges of the third superconducting wire material 13, it is possible to effectively suppress deterioration of the superconducting layer 3 in the connection location of the superconducting wire material and therefore, it is possible to obtain a connection structure of the superconducting wire material with excellent superconducting performance.

As shown in FIG. 6, by providing the fusing section 6 so as to cover the entire third superconducting wire material 13, it is possible to fuse the third superconducting wire material 13 to the first superconducting wire material 11 and the second superconducting wire material 12 so that the first superconducting wire material 11, the second superconducting wire material 12, and the third superconducting wire material 13 are electrically connected to each other. According to such structure, it is possible to decrease cases where the third superconducting wire material 13 falls out and it is possible to form a strong connection structure.

Figure 7A:
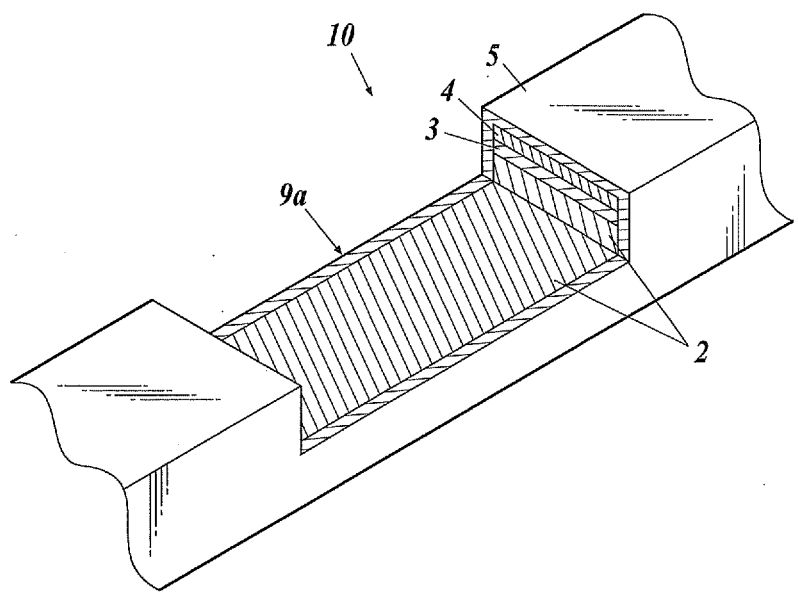
FIG. 7A is a diagram describing a step of forming an end of the superconducting wire material, and shows a state of forming a concave section which is a rectangular shape from a side view in the superconducting wire material.

According to the above embodiment, as shown in FIG. 2A, the depth that the superconducting wire material 10 is cut at the location where the concave section 9a is formed is gradually changed along the longitudinal direction of the superconducting wire material 10 to form the concave section 9a including the exposing face in a curved shape. However, as shown in FIG. 7A, it is possible to cut the superconducting wire material 10 at a certain depth at the location where the concave section 9a is formed to form the concave section 9a with a rectangular shape from a side view. By cutting at the certain depth, the area where an exposing face of the concave section 9a comes into contact with the filling material which fills the concave section 9a increases, and it is possible to achieve the advantage of the adhesion between the filling section 9 and the superconducting wire material 10 becoming stronger.

Figure 7B:
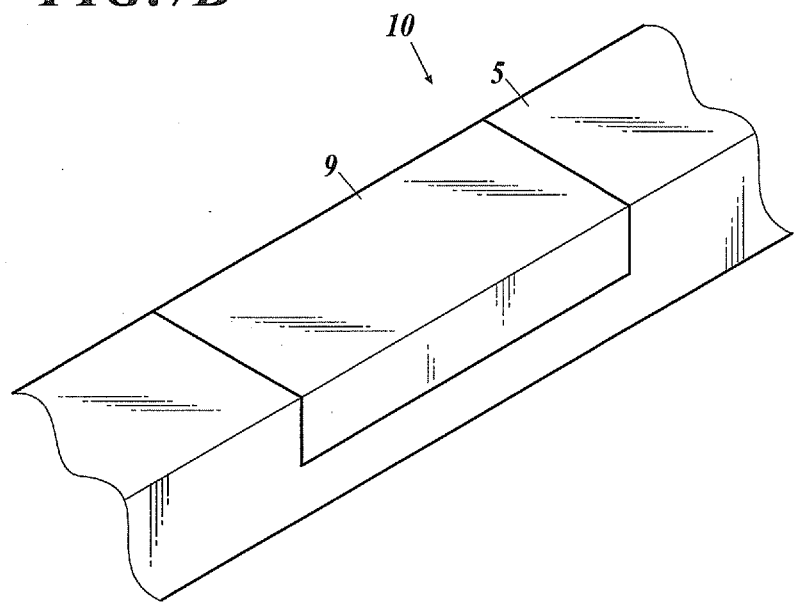
FIG. 7B is a diagram describing a step of forming an end of the superconducting wire material, and shows a state of providing a filling section in the concave section which is a rectangular shape from a side view.

By filling the filling material in the concave section 9a in a rectangular shape from a side view, as shown in FIG. 7B, it is possible to form the filling section 9 in a rectangular parallelepiped.

Figure 8A:
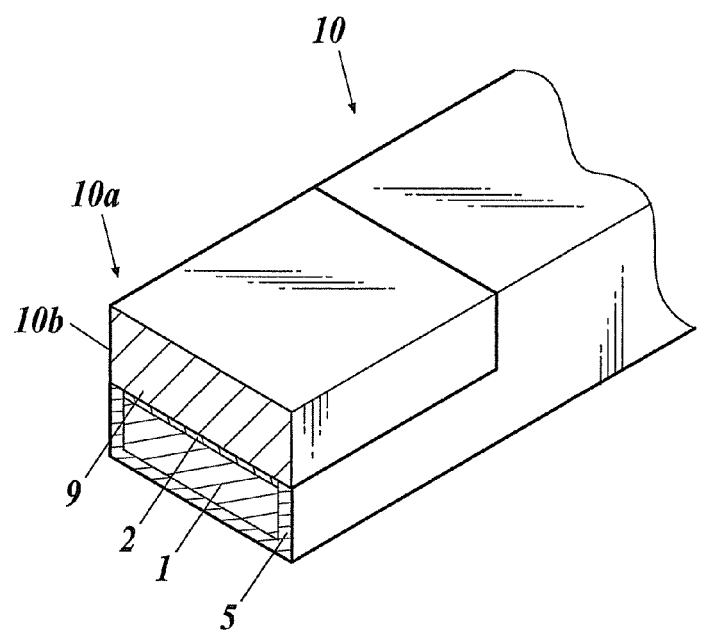
FIG. 8A is a perspective diagram showing another embodiment of an end of the superconducting wire material.
Figure 8B:
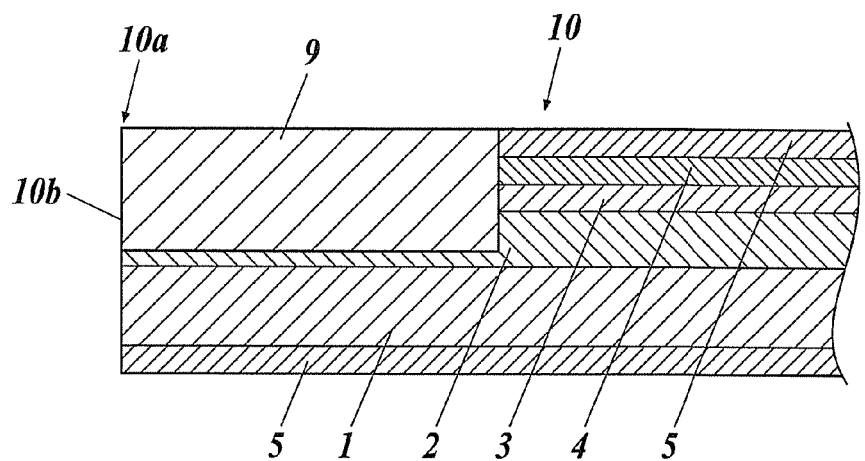
FIG. 8B is a cross-sectional view showing another embodiment of an end of the superconducting wire material, and shows an end where a filling section reaches an intermediate layer.

In the superconducting wire material 10 shown in FIG. 7B, by cutting the portion where the substrate 1, the intermediate layer 2, and the filling section 9 are overlapped, as shown in FIG. 8A and FIG. 8B, it is possible to form an end 10a including an edge face 10b where the substrate 1, the intermediate layer 2, and the filling section 9 are exposed at the cutting face in the state adjacent to each other.

Figure 8C:
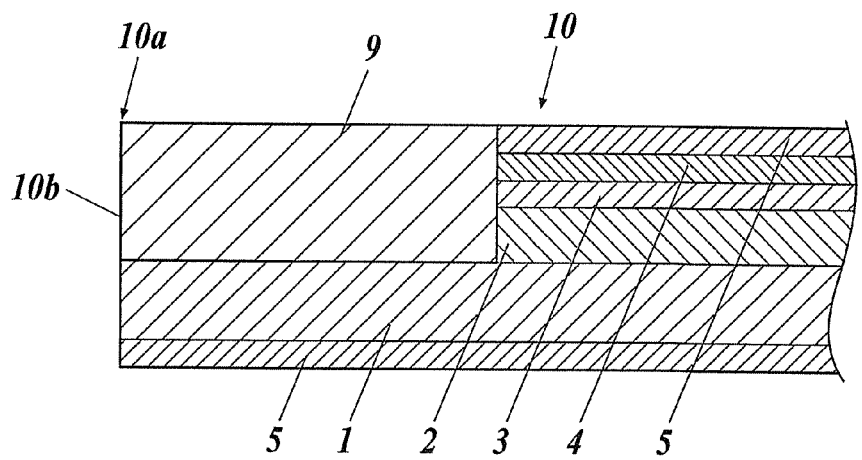
FIG. 8C is a cross-sectional diagram showing another embodiment of an end of the superconducting wire material, and shows an end where a filling section reaches an interface between an intermediate layer and a substrate.

As shown in FIG. 7A, the depth of cutting the superconducting wire material 10 is not limited to the depth of exposing the intermediate layer 2, and the superconducting wire material 10 can be cut at a depth which reaches the interface between the intermediate layer 2 and the substrate 1. In this case, it is possible to form the end 10a including the edge face 10b as shown in FIG. 8C.

Figure 8D:
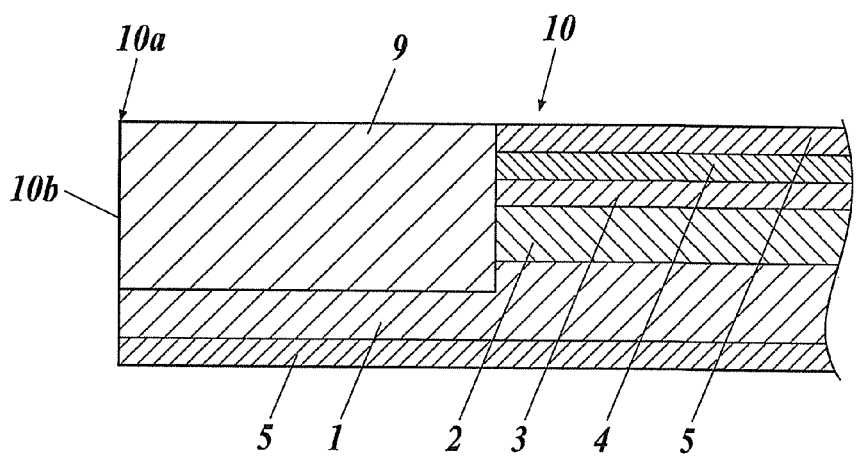
FIG. 8D is a cross-sectional diagram showing another embodiment of an end of the superconducting wire material, and shows an end where a filling section reaches a substrate.

It is possible to cut the superconducting wire material 10 at the depth of exposing the substrate 1, and in this case, it is possible to form the end 10a including the edge face 10b as shown in FIG. 8D.

In order to connect the third superconducting wire material 13 to the first superconducting wire material 11 and the second superconducting wire material 12 by only the fusing section 6, and to maintain tension strength of the connection portion, as shown in FIG. 8B, it is preferable to not make the depth of cutting too deep and to limit the depth up to the depth of the intermediate layer 2. When the filling section 9 is formed using the filling material including metal, as shown in FIG. 8C and FIG. 8D, by removing the entire intermediate layer 2 to expose the substrate 1, it is possible to enhance the adhesion of the filling section 9.

Figure 9A:
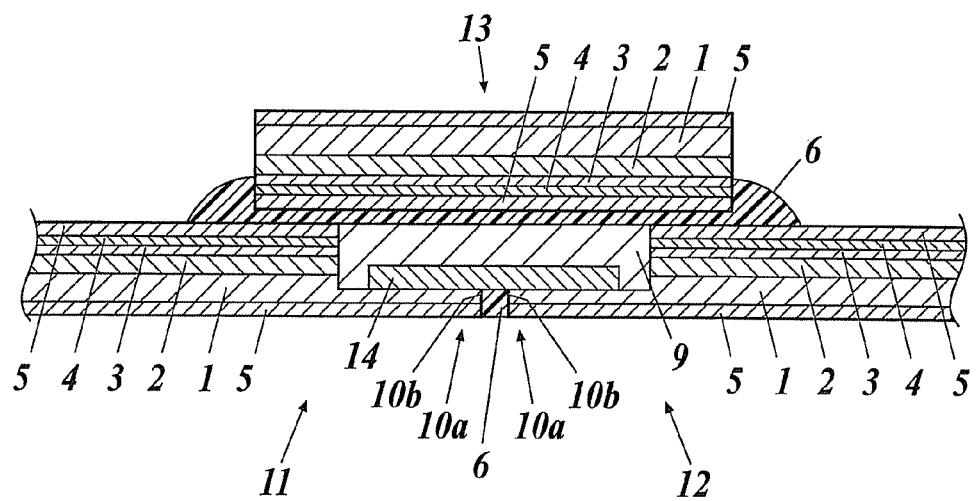
FIG. 9A is a cross-sectional diagram showing another embodiment of a connection structure of the superconducting wire material.
Figure 9B:
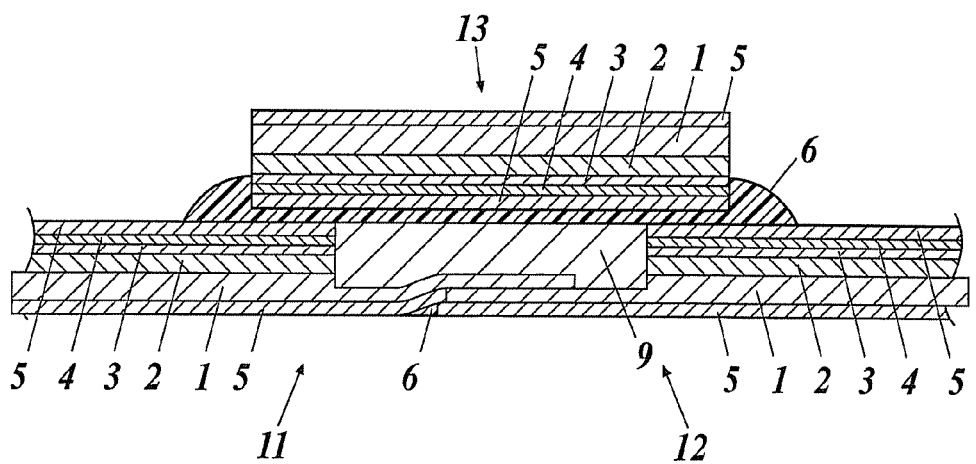
FIG. 9B is a cross-sectional diagram showing another embodiment of a connection structure of the superconducting wire material.

Moreover, FIG. 9A and FIG. 9B show other embodiments of the connection structure of the superconducting wire material.

According to the present embodiment, the substrates 1 of the first superconducting wire material 11 and the second superconducting wire material 12 are mechanically connected to each other by welding. In the connection structure of the superconducting wire material as shown in FIG. 9A, the substrates 1 are mechanically connected to each other through a connection substrate 14. In the connection structure of the superconducting wire material as shown in FIG. 9B, the substrates 1 are mechanically connected to each other directly.

As described above, by mechanically connecting the substrates 1 to each other, it is possible to provide a connection structure with higher strength. Specifically, when the superconducting wire material are connected to each other and then coiled, since a connection structure with high strength is necessary, the connection structure of the superconducting wire material as shown in FIG. 9A and FIG. 9B are suitable.

The connection structure of the superconducting wire material shown in FIG. 9A can be formed as described below.

First, the superconducting wire material 10 is cut from the superconducting layer 3 side of the superconducting wire material 10 until the substrate 1 is exposed and a portion of the substrate 1 is cut to form the concave section 9a. Next, the concave section 9a portion where the substrate 1 of the superconducting wire material 10 is exposed is cut. Such process is performed on two pieces of the superconducting wire material 10 to obtain the first superconducting wire material 11 and the second superconducting wire material 12 each including the end with the substrate 1 in an exposed state.

After the superconducting wire material 10 is cut, the portion corresponding to the above described concave section in the end including the cut face is cut to expose the substrate 1, and the first superconducting wire material 11 and the second superconducting wire material 12 each including the end with the substrate 1 in the exposed state are formed.

Next, the first superconducting wire material 11 and the second superconducting wire material 12 are positioned so that the ends with the substrate 1 in the exposed state oppose to each other with a gap in between, and the connection substrate 14 is positioned to bridge the respective substrates 1 so that the substrates 1 are mechanically connected to each other. Here, the substrate 1 and the connection substrate 14 are mechanically connected to each other by, for example electric welding. It is preferable that the connection substrate 14 include the same material as the substrate 1.

Next, the filling material is flown and solidified on the connection substrate 14 to form the filling section 9.

Next, similar to FIG. 4, the third superconducting wire material 13 is connected through the fusing section 6 on the upper face of the location where the first superconducting wire material 11 and the second superconducting wire material 12 are positioned opposed to each other. Here, the third superconducting wire material 13 is provided along the longitudinal direction of the first superconducting wire material 11 and the second superconducting wire material 12 so as to bridge the first superconducting wire material 11 and the second superconducting wire material 12.

With this, the connection structure of the superconducting wire material shown in FIG. 9A is formed.

In FIG. 9A, the fusing section 6 is provided in the gap between the ends of the first superconducting wire material 11 and the second superconducting wire material 12 on the lower face side of the connection substrate 14. However, the gap can be filled by providing the filling section 9. Moreover, the gap may not be provided with anything to leave a space. However, from the view point of mechanical strength, it is preferable to provide either the fusing section 6 or the filling section 9 in the gap between the ends of the first superconducting wire material 11 and the second superconducting wire material 12.

The connection structure of the superconducting wire material as shown in FIG. 9B can be formed by the following.

First, similar to the connection structure of the superconducting wire material as shown in FIG. 9A, the first superconducting wire material 11 and the second superconducting wire material 12 including the end with the substrate 1 in the exposed state are formed.

Next, the stabling layer 5 below the substrate 1 of one piece of the superconducting wire material, here, the first superconducting wire material 11 is scraped off.

Next, the substrate 1 of the first superconducting wire material 11 is overlapped on the substrate 1 of the second superconducting wire material 12 to mechanically connect the substrates 1 to each other. Here, the substrates 1 are mechanically connected to each other directly by electric welding.

Next, the filling material is flown and solidified on the substrate 1 to form the filling section 9.

Next, as shown in FIG. 4, the third superconducting wire material 13 is connected through the fusing section 6 to the upper face of the location where the first superconducting wire material 11 and the second superconducting wire material 12 are positioned opposing each other. Here, the third superconducting wire material 13 is provided along the longitudinal direction of the first superconducting wire material 11 and the second superconducting wire material 12 so as to bridge the first superconducting wire material 11 and the second superconducting wire material 12.

With this, the connection structure of the superconducting wire material as shown in FIG. 9B is formed.

In FIG. 9B, the fusing section 6 is provided in the space of the step portion of the stabilizing layer 5 in the location where the substrate 1 is overlapped. However, the space can be filled by providing a filling section 9. The step portion may not be provided with anything to leave a space. However, from the viewpoint of mechanical strength, it is preferable to provide the fusing section 6 or the filling section 9 in the step portion.

In the connection structure of the superconducting wire material as shown in FIG. 9A and FIG. 9B, it is preferable to perform cutting at about half of the thickness of the substrate 1 in the step of cutting a portion of the substrate 1.

By cutting at about half of the thickness of substrate 1, it is possible to suitably connect the substrates 1 to each other in the cut space while maintaining strength of the substrate 1 portion, and it is possible to make the face where the third superconducting wire material 13 is positioned to be flat.

The above described embodiments describe an example of the superconducting wire material 10 where the superconducting layer 3 is provided on only one face side of the substrate 1. However, the present invention is not limited to the above, and even in the superconducting wire material where the superconducting layer 3 is provided on both faces of the substrate 1, it is possible to employ a similar connection structure. Consequently, it is possible to obtain stable superconducting performance.

The specific detailed configuration and the like can be suitably modified.

INDUSTRIAL APPLICABILITY

Since the present invention includes a configuration as described above, the present invention can be used in techniques of connecting superconducting wires as the superconducting wire material, superconducting wire material connection structure, superconducting wire material connection method, and treatment method of superconducting wire material end.

DESCRIPTION OF REFERENCE NUMERALS 1 substrate
2 intermediate layer
3 superconducting layer
4 protecting layer
5 stabilizing layer
6 fusing section
9 filling section
9a concave section
10 superconducting wire material
10a end
10b edge face
11 first superconducting wire material
12 second superconducting wire material
13 third superconducting wire material
14 connection substrate

The invention claimed is:
1. A superconducting wire material connection structure which connects superconducting wire material to each other, the superconducting wire material including a superconduct- ing layer on a substrate, the superconducting wire material connection structure comprising:
- a first superconducting wire material and a second superconducting wire material each including an end provided with:
- a concave section in which at least the superconducting layer is removed; and
- a filling section in which filling material is filled in the concave section, wherein the first superconducting wire material and the second superconducting wire material are positioned so that the respective ends oppose to each other; and
- a third superconducting wire material which is connected to both the first superconducting wire material and the second superconducting wire material.

2. The superconducting wire material connection structure of claim 1, wherein the third superconducting wire material is connected to the first superconducting wire material and the second superconducting wire material with a fusing section including material with a melting point lower than the filling material.

3. The superconducting wire material connection structure of claim 2, wherein a superconducting layer of the third superconducting wire material is connected to superconducting layers of the first superconducting wire material and the second superconducting wire material through the fusing section.

4. The superconducting wire material connection structure of claim 1, wherein the substrates are joined to each other by welding.

5. The superconducting wire material connection structure of claim 1, wherein,
- the superconducting layer is formed on only one face side of the substrate in the superconducting wire material; and
- the third superconducting wire material is connected to both the first superconducting wire material and the second superconducting wire material by connecting respective faces on a side where the superconducting layer is formed.

6. A superconducting wire material which is a tape shape including a superconducting layer on a substrate, the superconducting wire material comprising:
- a concave section provided partially in a longitudinal direction, the concave section in which at least the superconducting layer is entirely removed in a width direction; and
- a filling section in which filling material is filled in the concave section, wherein
- a portion of the concave section is formed in an end of the superconducting wire material; and
- an interface between the filling section and the substrate is exposed from an edge face of the end.

7. The superconducting wire material of claim 6, further comprising,
- an intermediate layer between the substrate and the superconducting layer, wherein, at least a portion of the intermediate layer is removed in the concave section.

8. The superconducting wire material of claim 6, wherein the end is provided with a fusing section including material with a melting point lower than the filling material.

9. A superconducting wire material connection method which connects superconducting wire material to each other, the superconducting wire material including a superconducting layer on a substrate, the superconducting wire material connection method comprising:
- positioning a first superconducting wire material and a second superconducting wire material so that respective ends oppose to each other, wherein the first superconducting wire material and the second superconducting wire material each include the end provided with a concave section in which the superconducting layer is removed, and a filling section in which filling material is filled in the concave section; and
- connecting a third superconducting wire material to the first superconducting wire material and the second superconducting wire material so as to bridge the first superconducting wire material and the second superconducting wire material.

10. The superconducting wire material connection method of claim 9, wherein,
- the superconducting layer is formed on only one face side of the substrate in the superconducting wire material; and
- the third superconducting wire material is provided to bridge the first superconducting wire material and the second superconducting wire material, and the third superconducting wire material and the first superconducting wire material, and the third superconducting wire material and the second superconducting wire material are connected so that respective faces on a side where the superconducting layer is formed are opposed to each other.

11. A treatment method of superconducting wire material end including a superconducting layer on a substrate, the method comprising:
- forming a concave section by removing at least the superconducting layer;
- forming a filling section by filling the concave section with filling material; and
- cutting a portion where the substrate and the filling section are overlapped and there is no superconducting layer between the substrate and the filling section.

12. The treatment method of superconducting wire material end of claim 11, wherein
- an intermediate layer is formed between the substrate and the superconducting layer; and
- at least a portion of the intermediate layer is removed in the concave section.

13. The superconducting wire material of claim 7, wherein the end is provided with a fusing section including material with a melting point lower than the filling material.

* * * * *